(12) United States Patent
Cho

(10) Patent No.: US 8,319,227 B2
(45) Date of Patent: Nov. 27, 2012

(54) LIGHT EMITTING DEVICE

(75) Inventor: Hyun Kyong Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 343 days.

(21) Appl. No.: 12/488,907

(22) Filed: Jun. 22, 2009

(65) Prior Publication Data

US 2010/0207141 A1  Aug. 19, 2010

(30) Foreign Application Priority Data

Feb. 18, 2009 (KR) .................. 10-2009-0013573

(51) Int. Cl.
- H01L 27/15 (2006.01)
- H01L 31/12 (2006.01)
- H01L 33/00 (2010.01)

(52) U.S. Cl. ........ 257/79; 257/81; 257/99; 257/E33.065

(58) Field of Classification Search .................. 257/79, 257/81, 99, E33.065
See application file for complete search history.

(56) References Cited

U.S. PATENT DOCUMENTS

| 7,282,746 | B2 * | 10/2007 | Lee et al. | 257/94 |
| 7,482,189 | B2 | 1/2009 | Lee et al. | |
| 2002/0017652 | A1 | 2/2002 | Illek et al. | |
| 2005/0017253 | A1 * | 1/2005 | Hata | 257/80 |
| 2007/0077673 | A1 | 4/2007 | Hwang et al. | |
| 2007/0200135 | A1 | 8/2007 | Wang | |
| 2008/0032436 | A1 | 2/2008 | Lee et al. | |
| 2008/0048206 | A1 | 2/2008 | Lee et al. | |
| 2010/0187558 | A1 * | 7/2010 | Jeong | 257/99 |

FOREIGN PATENT DOCUMENTS

| CN | 1897319 A | 1/2007 |
| JP | 6-163981 A | 6/1994 |
| JP | 09-051139 A | 2/1997 |
| JP | 2007-214558 A | 8/2007 |
| KR | 10-0646570 B1 | 11/2006 |
| KR | 10-2007-0008026 A | 1/2007 |
| KR | 10-2007-0038272 A | 4/2007 |
| KR | 10-0858089 A | 9/2008 |

* cited by examiner

*Primary Examiner* — Thien F Tran
(74) *Attorney, Agent, or Firm* — Birch, Stewart, Kolasch & Birch, LLP

(57) ABSTRACT

A light emitting device (LED) is provided. The LED comprises a first conductivity type semiconductor layer, an active layer, and a second conductivity type semiconductor layer. The active layer is on the first conductivity type semiconductor layer. The second conductivity type semiconductor layer is on at least one side of the active layer and the first conductivity type semiconductor layer, and on the active layer.

19 Claims, 3 Drawing Sheets

LIGHT EMITTING DEVICE

CROSS-REFERENCE TO RELATED APPLICATIONS

The present application claims priority under 35 U.S.C. 119 to Korean Patent Application No. 10-2009-0013573 (filed on Feb. 18, 2009), which is hereby incorporated by reference in its entirety.

BACKGROUND

The present disclosure relates to light emitting devices (LEDs).

Light emitting devices (LEDs) are semiconductor devices that convert a current into light. After red LEDs was commercialized, red LEDs and green LEDs have been used as light sources for electronic devices including information communication devices.

For example, a gallium nitride (GaN) semiconductor has a high thermal stability and a wide band gap. The GaN semiconductor can be combined with other elements (e.g., In and Al) to fabricate a semiconductor layer emitting green, blue or white light, and its emitted wavelength is easy to control. Thus, the GaN semiconductor has attracted much attention in the technical fields of high-power electronic devices including LEDs.

According to the related art, not only GaN substrates but also heterogeneous substrates formed of different materials (e.g., silicon, sapphire, and silicon carbide (SiC)) are used to grow GaN epitaxial layers. When GaN-based materials are grown on such heterogeneous substrates, many defects such as threading dislocations (TD) are included in the grown thin layer due to the mismatches between crystal lattice coefficients and thermal expansion coefficients.

Also, according to the related art, a dry etching or wet etching-based isolation process is used to provide the isolation between LED chips. However, the LED may be damaged by plasma or chemicals during the etching-based isolation process, thus degrading the chip reliability.

SUMMARY

Embodiments provide light emitting devices (LEDs) having low crystal defects.

Embodiments also provide LEDs that do not require an isolation process for inter-chip isolation.

In one embodiment, a light emitting device (LED) comprises: a first conductivity type semiconductor layer; an active layer on the first conductivity type semiconductor layer; and a second conductivity type semiconductor layer on at least one side of the active layer and the first conductivity type semiconductor layer, and on the active layer.

In another embodiment, a light emitting device (LED) comprises: a first conductivity type semiconductor layer; an active layer on the first conductivity type semiconductor layer; a second conductivity type semiconductor layer on the sides of the active layer and the first conductivity type semiconductor layer; a second electrode layer on the second conductivity type semiconductor layer; and a first electrode under the first conductivity type semiconductor layer.

The details of one or more embodiments are set forth in the accompanying drawings and the description below. Other features will be apparent from the description and drawings, and from the claims.

DETAILED DESCRIPTION OF THE EMBODIMENTS

Light emitting devices (LEDs) according to embodiments will be described in detail with reference to the accompanying drawings.

In the description of embodiments, it will be understood that when a layer (or film) is referred to as being "on/over" another layer or substrate, it can be directly on/over another layer or substrate, or intervening layers can also be present. Further, it will be understood that when a layer is referred to as being "under/below" another layer, it can be directly under/below another layer, and one or more intervening layers can also be present. In addition, it will also be understood that when a layer is referred to as being "between" two layers, it can be the only layer between the two layers, or one or more intervening layers can also be present.

Figure 1:
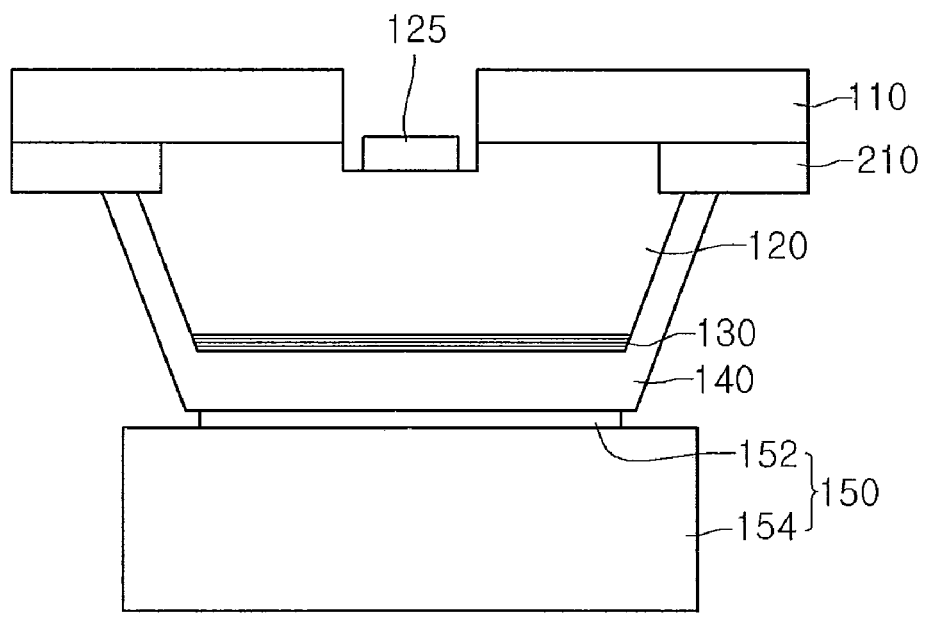
FIG. 1 is a sectional view of a light emitting device according to an embodiment.

FIG. 1 is a sectional view of a light emitting device (LED) according to an embodiment.

Referring to FIG. 1, an LED according to an embodiment can include: a first conductivity type semiconductor layer 120; an active layer 130 formed on the first conductivity type semiconductor layer 120; and a second conductivity type semiconductor layer 140 on at least one side of the active layer 130 and the first conductivity type semiconductor layer 120, and on the active layer 130.

The LED can further include: a second electrode layer 150 formed on the second conductivity type semiconductor layer 140; and a first electrode 125 formed on the first conductivity type semiconductor layer 120. The second electrode layer 150 can include an ohmic contact layer 152, a second substrate (154).

The non-described reference numerals in FIG. 1 will be described later with reference to FIGS. 2 to 5.

According to the embodiment, a selective growth process is used to grow a GaN-based material with low crystal defect in an LED structure, thus providing high internal efficiency, high reliability, and good current spreading.

According to the embodiment, using a selective growth process, the active layer is not grown on the side of the first conductivity type semiconductor layer and the second conductivity type semiconductor layer is grown on the side of the first conductivity type semiconductor layer. Thus, the active layer is not exposed and the second conductivity type semiconductor layer serves as a passivation layer preventing the generation of a leakage current. Therefore, the number of isolation processes for inter-chip isolation can be reduced and the damage caused by plasma or chemicals during the inter-chip isolation process can be reduced.

Also, according to the embodiment, the LED chip has the shape of a truncated inverted pyramid (TIP) after formation of the LED, thus providing a good light extraction effect.

FIGS. 2 to 5 are sectional views showing a method for fabricating a light emitting device according to an embodiment.

Figure 2:
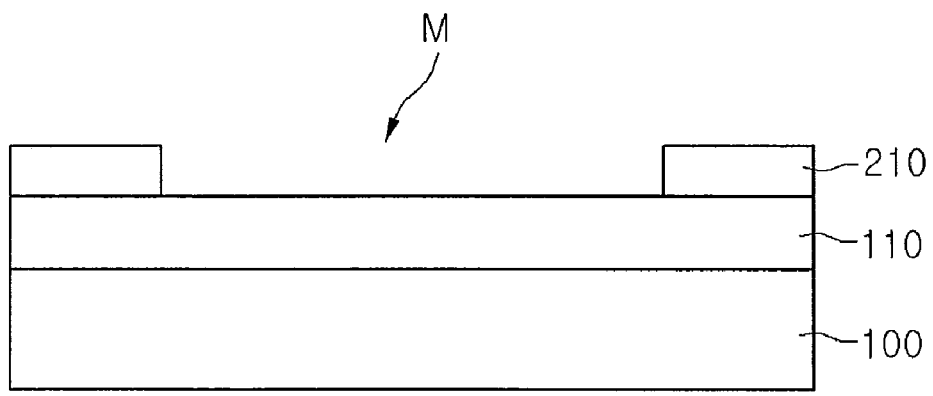
FIGS. 2 to 5 are sectional views showing a method for fabricating a light emitting device according to an embodiment.

Referring to FIG. 2, a first substrate 100 is prepared. The first substrate 100 can be a sapphire ($Al_2O_3$) monocrystalline substrate, a Si substrate, or a SiC substrate, to which the embodiment is not limited. A wet cleaning process can be performed to remove the impurities of the surface of the first substrate 100.

A nonconductive semiconductor layer 110 is formed on the first substrate 100. For example, an undoped-GaN layer can be formed on the first substrate 100, to which the embodiment is not limited. The formation of the nonconductive semiconductor layer 110 is a selective process that can be omitted. The formation of the nonconductive semiconductor layer 110 can improve the growth of a first conductivity type semiconductor layer 120, which will be formed thereon, and can prevent crystal defects from extending upward.

A first pattern 210 is formed on the nonconductive semiconductor layer 110 to expose a partial region M thereof. The first pattern 210 can remain in an inter-chip boundary region. For example, the first pattern 210 can be an oxide layer (e.g., $SiO_2$) or a nitride layer, to which the embodiment is not limited. For example, a plasma enhanced chemical vapor Deposition (PECVD) process can be used to deposit $SiO_2$ and a patterning process can be used to form the first pattern 210 exposing the partial region M.

Figure 3:
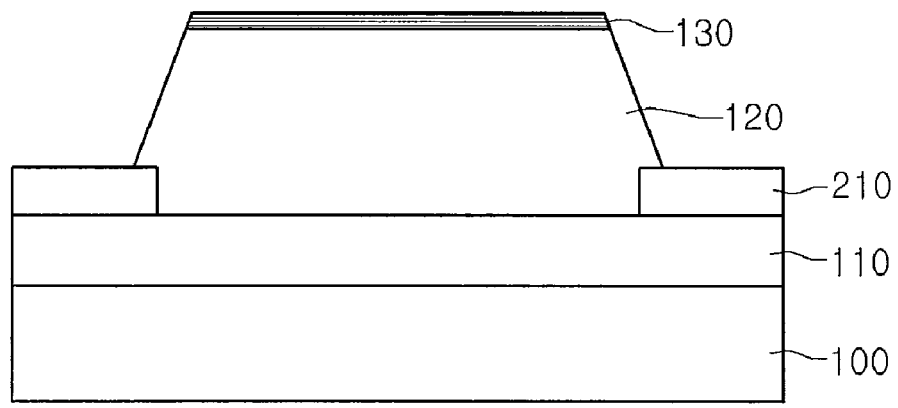

Referring to FIG. 3, a first conductivity type semiconductor layer 120 is formed on the exposed nonconductive semiconductor layer 110. For example, a chemical vapor deposition (CVD) process, a molecular beam epitaxy (MBE) process, a sputtering process, or a hydride vapor phase epitaxy (HVPE) process can be used to form an n-type GaN layer for the first conductivity type semiconductor layer 120. Also, the first conductivity type semiconductor layer 120 can be formed by injecting tri-methyl gallium gas (TMGa), ammonia gas ($NH_3$), nitrogen gas ($N_2$), or silane gas ($SiH_4$) containing n-type impurity such as silicon (Si) into a process chamber.

Herein, the first conductivity type semiconductor layer 120 can be grown sideways from a seed region (i.e., the exposed nonconductive semiconductor layer 110) to the first pattern 210. The first conductivity type semiconductor layer 120 on the first pattern 210 has high-quality crystallinity with little potential.

According to the embodiment, a selective growth process is used to grow a GaN-based material with low crystal defect in an LED structure, thus providing high internal efficiency, high reliability, and good current spreading.

An active layer 130 is formed on the first conductivity type semiconductor layer 120. The active layer 130 can have a quantum well structure that is formed by alternately laminating nitride semiconductor layers with different energy bands once or several times. For example, the active layer 130 can have a quantum well structure with an InGaN/GaN and/or InGaN/InGaN structure that is formed by injecting tri-methyl gallium gas (TMGa), ammonia gas ($NH_3$), nitrogen gas ($N_2$), or tri-methyl indium gas (TMIn), to which the embodiment is not limited.

Herein, the active layer 130 can be formed on the first conductivity type semiconductor layer 120. For example, a mask pattern (not shown) can be formed on the side of the first conductivity type semiconductor layer 120 and the active layer 130 can be formed on the first conductivity type semiconductor layer 120.

Figure 4:
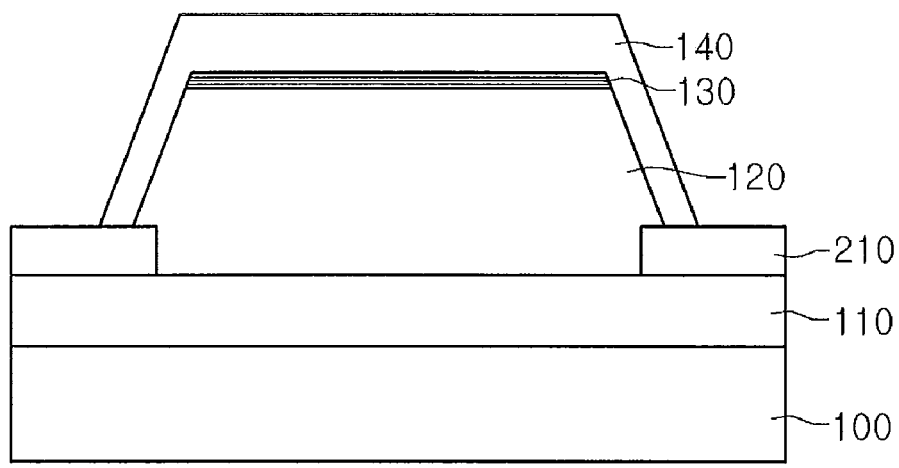

Referring to FIG. 4, a second conductivity type semiconductor layer 140 is formed on the active layer 130 and the first conductivity type semiconductor layer 120. For example, the second conductivity type semiconductor layer 140 can be formed by injecting tri-methyl gallium gas (TMGa), ammonia gas ($NH_3$), nitrogen gas ($N_2$), or bisethylcyclopentadienyl magnesium ($EtCp_2Mg$){$Mg(C_2H_5C_5H_4)_2$} containing p-type impurity such as magnesium (Mg) into a process chamber, to which the embodiment is not limited.

Herein, the second conductivity type semiconductor layer 140 can be formed to cover the active layer 130 and the first conductivity type semiconductor layer 120.

Also, the second conductivity type semiconductor layer 140 can be formed on the top and side of the active layer 130 and the side of the first conductivity type semiconductor layer 130.

Herein, the second conductivity type semiconductor layer 140 on the sides of the active layer 130 and the first conductivity type semiconductor layer 120 can be formed thinner than the second conductivity type semiconductor layer on the top of the active layer.

Herein, the second conductivity type semiconductor layer 140 on the sides of the active layer 130 and the first conductivity type semiconductor layer 120 can be formed to a thickness that does not cause a pn junction with the first conductivity type semiconductor layer. For example, the second conductivity type semiconductor layer 140 on the sides of the active layer 130 and the first conductivity type semiconductor layer 120 can be formed to a thickness of about 100 Å or less not to generate a depletion, to which the embodiment is not limited.

Also, the second conductivity type semiconductor layer 140 on the sides of the active layer 130 and the first conductivity type semiconductor layer 120 can be formed to have a high resistivity for isolation. For example, the second conductivity type semiconductor layer 140 on the sides of the active layer 130 and the first conductivity type semiconductor layer 120 can be formed to a thickness of about 100 Å or less, to which the embodiment is not limited.

According to the embodiment, using a selective growth process, the active layer is not grown on the side of the first conductivity type semiconductor layer and the second conductivity type semiconductor layer is grown on the side of the first conductivity type semiconductor layer. Thus, the active layer is not exposed and the second conductivity type semiconductor layer serves as a passivation layer preventing the generation of a leakage current. Therefore, the number of isolation processes for inter-chip isolation can be reduced and the damage caused by plasma or chemicals during the inter-chip isolation process can be reduced.

Figure 5:
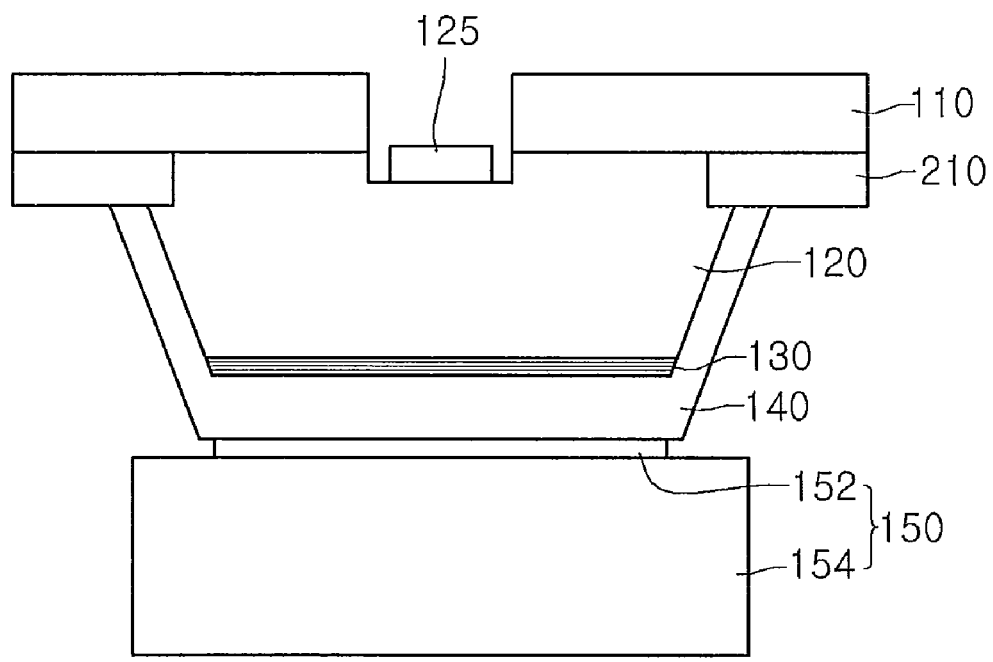

Referring to FIG. 5, a second electrode layer 150 is formed on the second conductivity type semiconductor layer 140. The second electrode layer 150 can include an ohmic contact layer 152, a reflection layer (not shown), a coupling layer (not shown), and a second substrate 154.

For example, the second electrode layer 150 can include an ohmic contact layer 152, and can be formed by laminating a single metal, a metal alloy, or a metal oxide several times in order to provide efficient hole injection. For example, the ohmic contact layer 152 can be formed of at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO, to which the embodiment is not limited.

Also, if the second electrode layer 150 includes the reflection layer, it can be formed of a metal layer containing aluminum (Al), argentum (Ag), or an Al or Ag-containing metal alloy. The Al or Ag effectively reflects the light generated from the active layer, thus making it possible to greatly improve the light extraction efficiency of the LED.

Also, if the second electrode layer 150 includes the coupling layer, the reflection layer can serve as the coupling layer or the coupling layer can be formed using nickel (Ni) or aurum (Au).

Also, the second electrode layer 150 can include the second substrate 154. If the first conductivity type semiconductor layer 120 has a sufficient thickness of about 50 μm or more, a process of forming the second substrate can be omitted. The second substrate 154 can be formed of highly conductive metal, metal alloy, or conductive semiconductor material in order to provide efficient hole injection. For example, the second substrate 154 can be formed of copper (Cu), Cu alloy, Si, Mo, or SiGe. The second substrate 154 can be formed using an electrochemical metal deposition process or a eutectic metal based bonding process.

The first substrate 100 is removed to expose the nonconductive semiconductor layer 110. Herein, the first substrate 100 can be removed using a high-power laser or a chemical etching process. Also, the first substrate 100 can be removed using a physical grinding process.

A portion of the nonconductive semiconductor layer 110 is removed, and a first electrode 125 is formed on the first conductivity type semiconductor layer 120. For example, an n-type electrode can be formed on the first conductivity type semiconductor layer 120.

Accordingly, as shown in FIG. 5, the LED chip has the shape of a truncated inverted pyramid (TIP), thereby making is possible to provide an external quantum efficiency of about 55% or more. For example, if the LED is an orange LED, it can provide a brightness of about 100 lm/W or more at about 100 mA, which exceeds the brightness of a fluorescent lamp.

According to the embodiment, the LED chip has the shape of a truncated inverted pyramid (TIP) after formation of the LED, thus providing a good light extraction effect.

In the embodiment, the first pattern 210 can or can not be removed, and a surface roughness can be formed on the nonconductive semiconductor layer 110 or the exposed first conductivity type semiconductor layer 120, thus making it possible to improve the light extraction efficiency. For example, a selective etching process based on a wet etching process can be used to remove the first pattern 210, and a dry etching process or a wet etching process can be used to form a surface roughness on the top of the nonconductive semiconductor layer 110 except the region corresponding to the first electrode 125.

According to the embodiment, a selective growth process is used to grow a GaN-based material with low crystal defect in an LED structure, thus providing high internal efficiency, high reliability, and good current spreading.

According to the embodiment, using a selective growth process, the active layer is not grown on the side of the first conductivity type semiconductor layer and the second conductivity type semiconductor layer is grown on the side of the first conductivity type semiconductor layer. Thus, the active layer is not exposed and the second conductivity type semiconductor layer serves as a passivation layer preventing the generation of a leakage current. Therefore, the number of isolation processes for inter-chip isolation can be reduced and the damage caused by plasma or chemicals during the inter-chip isolation process can be reduced.

Also, according to the embodiment, the LED chip has the shape of a truncated inverted pyramid (TIP) after formation of the LED, thus providing a good light extraction effect.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device (LED) comprising:
a first conductivity type semiconductor layer;
an active layer on the first conductivity type semiconductor layer;
a second conductivity type semiconductor layer on the sides of the active layer and the first conductivity type semiconductor layer;
a second electrode layer on the second conductivity type semiconductor layer;
a first electrode under one portion of the first conductivity type semiconductor layer; and
a nonconductive semiconductor layer under another portion of the first conductivity type semiconductor layer,
wherein the second conductivity type semiconductor layer on the sides of the active layer and the first conductivity type semiconductor layer is thinner than the second conductivity type semiconductor layer on the top of the active layer.

2. The LED of claim 1, wherein the second conductivity type semiconductor layer on the side of the first conductivity type semiconductor layer does not cause a depletion.

3. The LED of claim 1, wherein the second electrode layer comprises at least one or more of an ohmic contact layer, a reflection layer, a coupling layer, and a second substrate.

4. The LED of claim 1, comprising a surface roughness under the first conductivity type semiconductor layer.

5. The LED of claim 1, wherein the second conductivity type semiconductor layer is on the top and side of the active layer and the side of the first conductivity type semiconductor layer.

6. The LED of claim 1, further comprising a first pattern at both sides of the first conductivity type semiconductor layer.

7. The LED of claim 6, wherein the first conductivity type semiconductor layer is also on the first pattern.

8. The LED of claim 1, wherein the active layer is not formed on the side of the first conductivity type semiconductor layer, and the second conductivity type semiconductor layer is formed on the side of the first conductivity type semiconductor layer.

9. The LED of claim 8, wherein the active layer is not exposed and the second conductivity type semiconductor layer serves as a passivation layer preventing a generation of a leakage current.

10. The LED of claim 1, wherein the second conductivity type semiconductor layer on the sides of the active layer and the first conductivity type semiconductor layer are formed to a thickness that does not cause a pn junction with the first conductivity type semiconductor layer.

11. The LED of claim 1, wherein the second conductivity type semiconductor layer on the sides of the active layer and the first conductivity type semiconductor layer are formed to a thickness of about 100 Å or less not to generate a depletion.

12. The LED of claim 1, wherein the second conductivity type semiconductor layer on the sides of the active layer and the first conductivity type semiconductor layer are formed to have a high resistivity for isolation.

13. A light emitting device (LED) comprising:
a first conductivity type semiconductor layer;
an active layer on the first conductivity type semiconductor layer;
a second conductivity type semiconductor layer on the sides of the active layer and the first conductivity type semiconductor layer;
a second electrode layer on the second conductivity type semiconductor layer; and
a first electrode under the first conductivity type semiconductor layer,
wherein the active layer is not formed on the side of the first conductivity type semiconductor layer, and the second conductivity type semiconductor layer is formed on the side of the first conductivity type semiconductor layer.

14. The LED of claim 13, further comprising a nonconductive semiconductor layer under the first conductivity type semiconductor layer.

15. The LED of claim 13, wherein the second conductivity type semiconductor layer on the sides of the active layer and the first conductivity type semiconductor layer are formed to a thickness that does not cause a pn junction with the first conductivity type semiconductor layer.

16. The LED of claim 13, wherein the second conductivity type semiconductor layer on the sides of the active layer and the first conductivity type semiconductor layer are formed to a thickness of about 100 Å or less not to generate a depletion.

17. The LED of claim 13, wherein the second conductivity type semiconductor layer on the sides of the active layer and the first conductivity type semiconductor layer are formed to have a high resistivity for isolation.

18. A light emitting device (LED) comprising:
a first conductivity type semiconductor layer;
an active layer on the first conductivity type semiconductor layer;
a second conductivity type semiconductor layer on the sides of the active layer and the first conductivity type semiconductor layer;
a second electrode layer on the second conductivity type semiconductor layer; and
a first electrode under the first conductivity type semiconductor layer,
wherein the second conductivity type semiconductor layer on the sides of the active layer and the first conductivity type semiconductor layer are formed to have a high resistivity for isolation.

19. The LED of claim 18, wherein the second conductivity type semiconductor layer on the sides of the active layer and the first conductivity type semiconductor layer are formed to a thickness that does not cause a pn junction with the first conductivity type semiconductor layer.

* * * * *